United States Patent
Niarfeix et al.

(10) Patent No.: US 9,227,823 B2
(45) Date of Patent: Jan. 5, 2016

(54) ROLLING BEARING ASSEMBLY WITH ROTATION SENSING MEANS, ELECTRIC MACHINE PROVIDED WITH SUCH AN ASSEMBLY AND FORK LIFT TRUCK COMPRISING SUCH AN ELECTRIC MACHINE

(75) Inventors: Francois Niarfeix, Saint Cyr sur Loire (FR); Gertjan Van Amerongen, Scherpenzeel (NL)

(73) Assignee: AKTIEBOLAGET SKF, Gothenburg (SE)

( * ) Notice: Subject to any disclaimer, the term of this patent is extended or adjusted under 35 U.S.C. 154(b) by 405 days.

(21) Appl. No.: 13/375,783

(22) PCT Filed: Jun. 12, 2009

(86) PCT No.: PCT/IB2009/053236
§ 371 (c)(1),
(2), (4) Date: Dec. 2, 2011

(87) PCT Pub. No.: WO2010/143022
PCT Pub. Date: Dec. 16, 2010

(65) Prior Publication Data
US 2012/0086313 A1 Apr. 12, 2012

(51) Int. Cl.
*G01P 3/48* (2006.01)
*B66F 9/08* (2006.01)
*H01L 21/00* (2006.01)
*G01D 5/245* (2006.01)
*G01P 3/44* (2006.01)
(Continued)

(52) U.S. Cl.
CPC ............... *B66F 9/08* (2013.01); *G01D 5/2451* (2013.01); *G01P 3/443* (2013.01); *H01L 21/00* (2013.01); *E06B 1/00* (2013.01); *F16C 19/06* (2013.01); *F16C 41/007* (2013.01); *H01L 2221/00* (2013.01)

(58) Field of Classification Search
CPC ....... H01L 21/00; H01L 2221/00; E06B 1/00; G02F 1/00; G02F 2201/00; G02F 2101/00
USPC .................. 324/173–174, 207.25; 73/514.16, 73/514.31, 514.39
See application file for complete search history.

(56) References Cited

U.S. PATENT DOCUMENTS 3,282,397 A * 11/1966 Grunwald ...................... 198/394
3,912,456 A * 10/1975 Young ............................. 436/47
(Continued)

FOREIGN PATENT DOCUMENTS

EP 1096234 A1 5/2001
EP 1211500 A1 6/2002
(Continued)

*Primary Examiner* — Huy Q Phan
*Assistant Examiner* — Temilade Rhodes-Vivour
(74) *Attorney, Agent, or Firm* — Bryan Peckjian; SKF USA Inc. Patent Dept.

(57) ABSTRACT

This rolling bearing assembly (2) comprises a rolling bearing (4) with an inner ring (8), an outer ring (6) and several rolling bodies (10) between the inner and outer rings, at least one sensor (30) adapted to detect a rotation parameter of a first ring (8) with respect to a second ring (6) of the rolling bearing and a support member (40) holding the sensor (30) in position with respect to the rolling bearing (4). The support member (40) holds the sensor (30) in a position such that at least one connecting pin (34, 36, 38) of the sensor (30) extends in a volume (46) defined by the support member (40) and adapted to accommodate an electrical connector (100).

20 Claims, 5 Drawing Sheets

(51) Int. Cl.
　　　*E06B 1/00*　　　(2006.01)
　　　*F16C 41/00*　　　(2006.01)
　　　*F16C 19/06*　　　(2006.01)

(56)　　　References Cited

U.S. PATENT DOCUMENTS

| | | | |
|---|---|---|---|
| 4,728,923 A | | 3/1988 | Finger |
| 5,545,853 A | | 8/1996 | Hildreth |
| 6,269,114 B1 | * | 7/2001 | Paterno .......................... 375/224 |
| 6,269,319 B1 | * | 7/2001 | Neisch et al. ................. 702/118 |
| 6,373,257 B1 | * | 4/2002 | Macbeth et al. ............... 324/536 |
| 7,075,325 B2 | * | 7/2006 | Park et al. ................. 324/756.05 |
| 2005/0251360 A1 | * | 11/2005 | Bhateja et al. ................ 702/127 |
| 2006/0278022 A1 | * | 12/2006 | Ono .......................... 73/862.322 |
| 2007/0053622 A1 | * | 3/2007 | Gallion et al. ................ 384/448 |

FOREIGN PATENT DOCUMENTS

| | | | |
|---|---|---|---|
| EP | 1404013 A1 | | 3/2004 |
| JP | 2006010691 A | * | 1/2006 |
| JP | 2007024778 A | * | 2/2007 |

* cited by examiner

ROLLING BEARING ASSEMBLY WITH ROTATION SENSING MEANS, ELECTRIC MACHINE PROVIDED WITH SUCH AN ASSEMBLY AND FORK LIFT TRUCK COMPRISING SUCH AN ELECTRIC MACHINE

CROSS-REFERENCE

This application is the US national stage of International Application No. PCT/IB2009/053236 filed on Jun. 12, 2009.

TECHNICAL FIELD OF THE INVENTION

This invention relates to a rolling bearing assembly comprising, amongst others, an encoder washer, fast in rotation with one of the rings of the rolling bearing, and sensing means adapted to detect a rotation parameter of this encoder washer, such sensing means being connected to an electronic circuit via an electric cable. The invention also relates to a rotary electric machine provided with such a rolling bearing assembly and to a fork lift truck comprising such a rotary electric machine.

BACKGROUND OF THE INVENTION

A rolling bearing comprises an inner ring, an outer ring and several rolling bodies installed between these two rings. These rolling bodies can be balls, rollers or needles. In the meaning of the invention, a rolling bearing can be, for instance, a ball bearing, a roller bearing or a needle bearing.

In the field of rolling bearings, it is known to use a tachometer in order to determine the rotation speed of a member supported by a rolling bearing. For instance, truck lifts are equipped with electric motors to move upwardly or downwardly the forks of the truck. The position and speed of the forks must be controlled for safety reasons. In this context, it is known to use an instrumented rolling bearing assembly in order to support a rotating shaft of an electric motor with respect to a frame and to provide a variable-voltage regulator with some information with respect to a rotation parameter of the rotating shaft.

Such an instrumented rolling bearing assembly includes a sensor, in the form of an electronic component such as a Hall effect cell, and possibly some other electronic components for the treatment of the output signal of such a sensor. Such electronic components are subjected to an electromagnetic environment which is influenced, for instance, by the stator of the motor. Moreover, electronic fast transient phenomenons or "EFT" occur within such machines, such phenomenons being likely to damage the electronic components, in particular the sensor. For instance, in the case of a fork lift truck, the truck can charge electrostatically when moving on a plastic ground and, when it comes close to a grounded conducting element such as a metallic shelf, a fast discharge can occur which might damage the electronic components.

Such electromagnetic fast transient phenomenons or "EFT" have been taken into consideration so far by incorporating, next to the sensor or the electronic components of a rolling bearing assembly, an electronic filter to protect the electronic components of the rotation sensing means. Such a filter is bulky and increases the overall volume of the rolling bearing assembly to such an extent that it may prevent the rolling bearing assembly from being used in some circumstances. In some cases, the electronic filter has been reduced in size in order to fit with small diameters rolling bearing assemblies but, in such a case, the electronic filter is not really efficient.

On the other hand, it is known, e.g. from EP-A-1 211 500 to use an EMI filter as noise filter for eliminating high-frequency noise. Such a filter is not adapted to EFT and increases the overall volume of the bearing assembly.

SUMMARY OF THE INVENTION

This invention aims at solving these problems with a new rolling bearing assembly which is compact and efficiently protected against electromagnetic fast transient phenomenons, or "EFT".

To this end, the invention concerns a rolling bearing assembly comprising a rolling bearing with an inner ring, an outer ring and rolling bodies between the inner and outer rings, an encoder washer fast in rotation with a first one of the inner and outer rings, sensing means fast in rotation with a second one of the inner and outer rings, said sensing means being adapted to detect a rotation parameter of the encoder washer, and an electric cable with a first end connected to the sensing means and a second end adapted to be connected to an electronic circuit. According to the invention, a filter for transient voltage oscillations due to electromagnetic fast transient phenomenons is mounted on the cable, between its first and second ends.

Thanks to the invention, the filter for transient voltage oscillations efficiently protects the electric components of the sensing means, such as the sensor, without substantially increasing the size of the rolling bearing, since it is mounted on the cable, at a distance of the rolling bearing which is such that the filter does not mechanically interfere with the direct environment of the rolling bearing. As the filter is located between the first and second ends of the cable, it leaves the second end of the cable free to accommodate any kind of connector, in particular a connector chosen on the basis of the electronic circuit to which the electric cable is to be connected, for instance a variable-voltage regulator. The connector mounted at the second end of the cable can be compact and selected on the basis of the electrical environment of the rolling bearing assembly.

A rotation parameter of one part with respect to another part is a parameter which is representative of a pivoting movement. Such a parameter can be an angle, measuring the angular position of one part with respect to the other around the central axis of the rolling bearing. Such a parameter can also be a speed, a displacement, an acceleration or a vibration.

According to further aspects of the invention which are advantageous but not compulsory, the rolling bearing assembly might incorporate one or several of the following features, taken in any technically admissible configuration:

- The second end of the cable is equipped with a connector for its connection to an electronic circuit. Advantageously, this connector does not include any electronic filtering means.
- The filter includes several electronic components, exclusive of diodes.
- The filter is an RC circuit, at least for low frequency currents.
- The cable has four conductors with a first conductor conveying a positive voltage to the sensing means, a second conductor conveying a negative voltage to the sensing means, a third conductor and a fourth conductor conveying an output signal of the sensing means and the filter includes first, second, third and fourth tracks respectively joining first and second parts of said first, second, third and fourth conductors, each of the first, third and fourth tracks having a resistance in series and being connected to the second track by at least two parallel lines having each a capacitor in series, the two capacitors of the two lines connecting one of the first, third or fourth tracks to the second tracks having different values.

A first capacitor, amongst the two capacitors of the two lines connecting one of the first, third or fourth tracks to the second track, has a value between 0.5 nF and 5 nF, whereas the second one of said capacitors has a value between 2 nF and 60 nF.

The cable has four conductors with a first conductor conveying a positive voltage to the sensing means, a second conductor conveying a negative voltage to the sensing means, a third conductor and a fourth conductor conveying an output signal of the sensing means and the filter includes first, second, third and fourth tracks respectively joining first and second parts of said first, second, third and fourth conductors, each of the first, third and fourth tracks having a resistance in series and being connected to the second track by at least two parallel lines, the lines connecting the first track to the second track having each a capacitor in series, whereas two lines connecting the third and fourth tracks to the second track respectively have in series a capacitor for the first line and a set of two back-to-back Zener diodes for the second line.

The resistance mounted in series on each of the first, third and fourth tracks has a value between 200 and 600.

The first track has a ferrite bead in series and is connected to the second track by a third line having a third capacitor in series. This third capacitor advantageously has a value between 100 nF and 1000 nF.

The electronic components forming the filter are selected on the basis of the electronic properties of the conductors of the cable and its lengths, respectively between the first end and the filter and between the filter and the second end.

The filter is housed in a protective casing. In such a case, and when the second end of the cable is provided with a connector, this connector and the casing advantageously have circular cross sections and the maximum diameter of the casing is smaller than or equal to the maximum diameter of the connector.

The invention also concerns a rotary electric machine comprising, amongst others, a frame, a stator, a shaft and a rotor mounted on this shaft, wherein the shaft is supported with respect to the frame by a rolling bearing assembly as mentioned here-above. Such a rotary electric machine is efficiently protected against EFT and allows to monitor the position of its rotating shaft.

Finally, the invention concerns a fork lift truck comprising at least one such rotary electric machine. Such a lift truck can work in electromagnetic severe conditions while using feedback signals to control actuation of some rotary electric machines mounted on its frame.

BRIEF DESCRIPTION OF THE DRAWINGS

The invention will be better understood on the basis of the following description which is given in correspondence with the annexed figures and as an illustrative example, without restricting the object of the invention. In the annexed figures.

DETAILED DESCRIPTION OF SOME EMBODIMENTS

Figure 1:
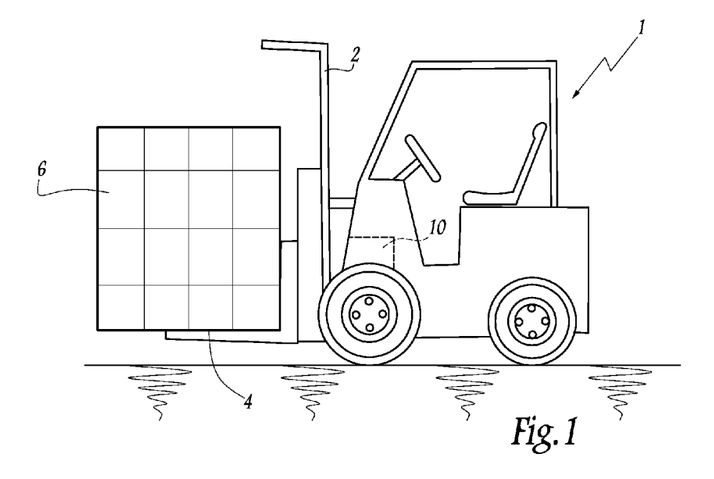
FIG. 1 is a schematic view of a lift truck according to the invention.

The lift truck 1 represented on FIG. 1 has a mast 2 provided with forks 4 used to lift a load 6. A direct current electric motor 10 is used to drive the forks 4 along mast 2. Motor 10 has a frame 12 which houses a stator 14 and supports a rotatable shaft 16 equipped with a rotor 18. Shaft 16 is mechanically connected to forks 4 by non represented means, such as a chain.

Shaft 16 is supported by frame 12 via a rolling bearing assembly 20 which comprises a rolling bearing 22, said rolling bearing including an inner ring 24, an outer ring 26, several balls 28 and a cage 30 holding the balls in a rolling chamber defined radially between the inner radial surface of ring 26 and the outer radial surface of ring 24.

$X_{20}$ denotes the central axis of rolling bearing assembly 20 which is the axis of rotation of rings 24 and 26, one with respect to the other. In the present description, the words "axial", "radial", "axially" and 'radially" relate to axis $X_{20}$. A direction is "axial" when it is parallel to this axis and "radial" when it is perpendicular to and secant with this axis.

Figure 3:
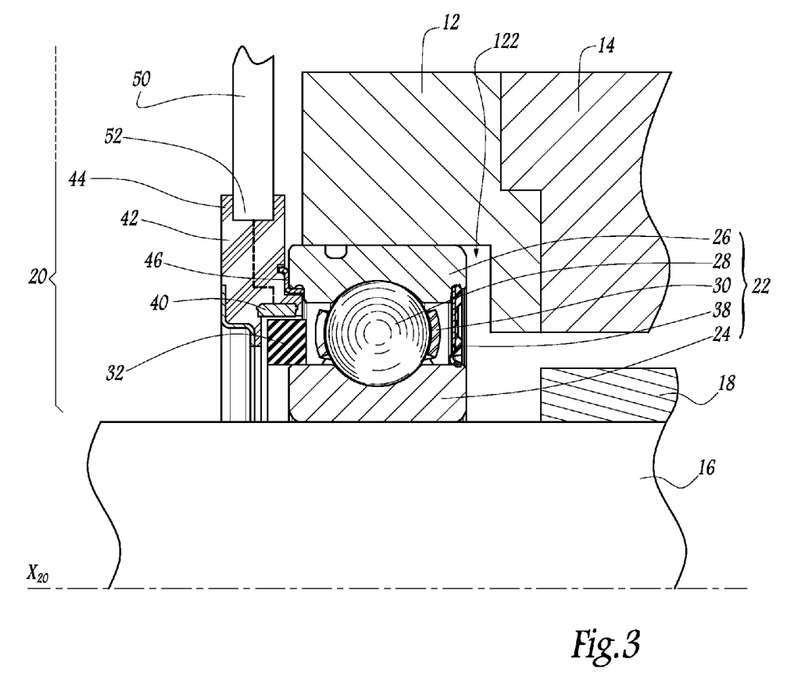
FIG. 3 is a half cut view, on a larger scale, along line III-III on FIG. 2.

As shown on FIG. 3, inner ring 24 is fitted on shaft 16 and fast in rotation with this shaft, whereas outer ring 26 is immobilized within a housing 122 formed by frame 12.

An encoder washer 32, which comprises for instance two permanent magnets, is fixedly mounted on the outer radial surface of inner ring 24, so that it rotates with items 16 and 24 around axis $X_{20}$.

A sealing gasket 38 is mounted on outer ring 26 and extends towards inner ring 24, on the side of these rings opposite to encoder washer 32.

A sensor 40, in the form of a two Hall effect detection cells in a preferred embodiment of the invention, is mounted next to encoder washer 32 so that it can detect the variations of the magnetic field when encoder washer 32 rotates around axis $X_{20}$. Sensor 40 is mounted on an annular support member 42 which holds a non represented printed circuit board having electronic components adapted to feed sensor 40 with an electric current and to convey and/or treat an output signal of this sensor.

Support member 42 is fixedly mounted on outer ring 26 via an elastic mounting washer 46, so that sensor 40 is held in position with respect to outer ring 26.

A cable 50 is connected to the printed circuit board and support member 40 extends locally outwardly in order to form a socket 44 which receives and holds a first end 52 of cable 50.

Figure 6:
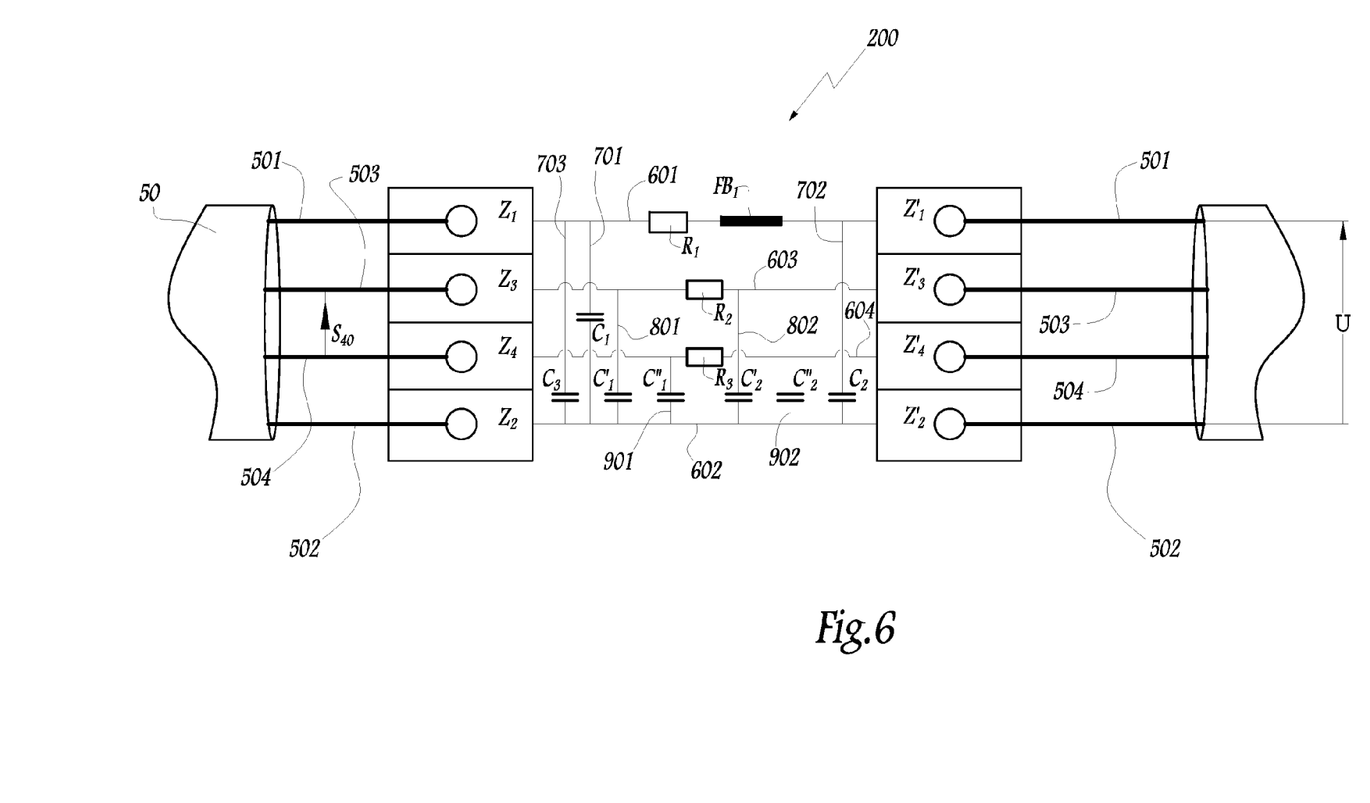
FIG. 6 is a circuit diagram of the EFT filter of the rolling bearing assembly of FIG. 5.

The general shape of washer 46 is shown on FIG. 6. Washer 46 radially surrounds support member 42, but for the angular sector corresponding to socket 44.

For the sake of simplicity, the printed circuit board is not represented on FIG. 3 and a dotted line shows the connection between sensor 40 and cable end 52 via the printed circuit board.

Figure 2:
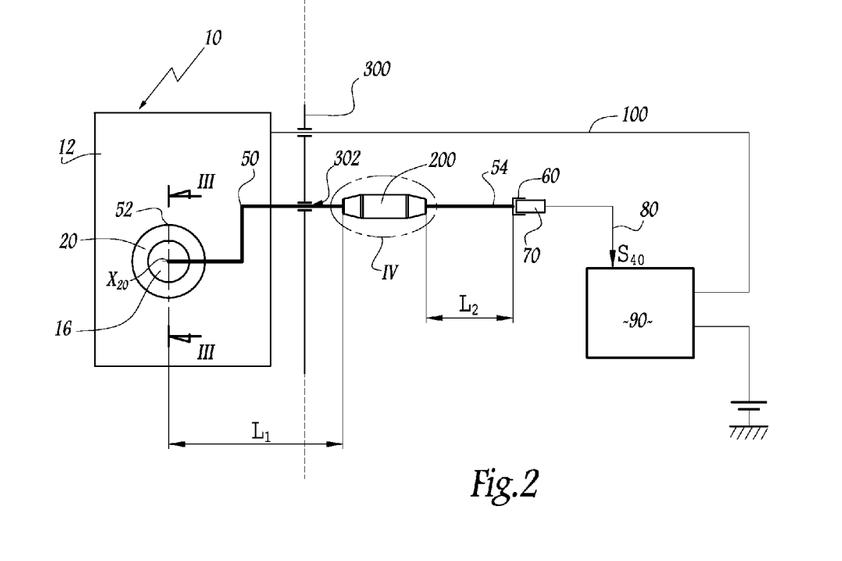
FIG. 2 is a schematic view of an electric motor used in the fork lift truck of FIG. 1 and an associated variable-voltage regulator.

The second end 54 of cable 50 is provided with a connector 60 adapted to cooperate with a corresponding connector 70 mounted at the end of a connection line 80 feeding a variable-voltage regulator 90 with a signal $S_{40}$ delivered by sensor 40 through the associated electronic components. Variable voltage regulator 90 feeds electric motor 10 with current via a second connection line 100. In other words, variable-voltage regulator 90 can take into account the output signal $S_{40}$ of the sensing means including sensor 40 in order to control electric motor 10.

A filter 200 is provided on cable 50, at an intermediate position, between its ends 52 and 54 in order to protect the sensing means supported by support member 42, in particular sensor 40, against electromagnetic fast transient or EFT phenomenons.

$L_1$ denotes the length of cable 50 between socket 44 and EFT filter 200, whereas $L_2$ denotes the length of cable 50 between EFT filter 200 and connector 60. Length $L_1$ is, for mechanical reasons larger than 10 cm, preferably larger than 15 cm. However $L_1$ is preferably smaller than 50 cm, for electrical reasons. Indeed, the further the filter from the sensing electronics to protect, the less efficient the filter is. Filter 200 can be located at a distance of rolling bearing 22 and shaft 16, so that it does not directly interfere with motor 10. On the other hand, length $L_2$ larger than 10 cm, preferably larger than 15 cm, which is sufficient to keep the assembly made of items 50, 60 and 200 supple in order to go through an opening 302 provided in an internal wall 300 of lift truck 1 for the passage of cable 50.

EFT filter 200 includes a printed circuit board or PCB 202 and a plastic casing 204 with a circular cross section. $D_{204}$ denotes the maximum diameter of casing 204.

Cable 50 includes four electric conductors 501, 502, 503 and 504. Electric conductor 501 conveys a positive voltage from regulator 90 to the sensing means supported by support member 42, whereas conductor 502 conveys a negative current from regulator 90 to the same sensing means. Conductors 503 and 504 convey the output signal $S_{40}$ of the sensing means towards regulator 90. Conductors 501 to 504 are cut at the level of filter 200 and eight connecting zone $Z_1$ to $Z_4$ and $Z'_1$ to $Z'_4$ are provided on PCB 202 for the connection of the first and second parts of conductors 501 to 504 respectively located between first end 52 and EFT filter 200, and between second end 54 and EFT filter 200.

A first track 601 extends on PCB 202, between connecting zones $Z_1$, $Z'_1$, for joining the first and second parts of conductor 501. Similarly, conducting tracks 602, 603 and 604 respectively extend on PCB 202, between the connecting zones $Z_2$ and $Z'_2$, $Z_3$ and $Z'_3$, $Z_4$ and $Z'_4$, for joining the first and second parts of conductors 502, 503 and 504.

A first resistance $R_1$ and a ferrite bead $FB_1$ are mounted in series on track 601. Second and third resistances $R_2$ and $R_3$ are respectively mounted in series on tracks 603 and 604. Resistances $R_1$, $R_2$ and $R_3$ have the same value which is between 200 and 600, preferably in the order to 50Ω.

Track 601 is connected by three parallel conducting lines 701, 702 and 703 to track 602 and each line 701, 702 and 703 is equipped with a capacitor in series, respectively $C_1$, $C_2$ and $C_3$. If one considers the current flowing from regulator 90 to sensing means supported by member 42, line 702 extends between tracks 601 and 602 upstream of ferrite bead $FB_1$ and resistance $R_1$, whereas lines 701 and 703 extend between these tracks downstream of $R_1$ and $FB_1$.

Track 603 is connected by two parallel connecting lines 801 and 802, on either side of resistance $R_2$, each of lines 801 and 802 being equipped with a capacitor in series, respectively $C'_1$ and $C'_2$.

Similarly, track 604 is connected to track 602 by two parallel connecting lines 901 and 902 distributed on either side of resistance $R_3$ and having each a capacitor in series, respectively $C''_1$ and $C''_2$.

Figure 4:
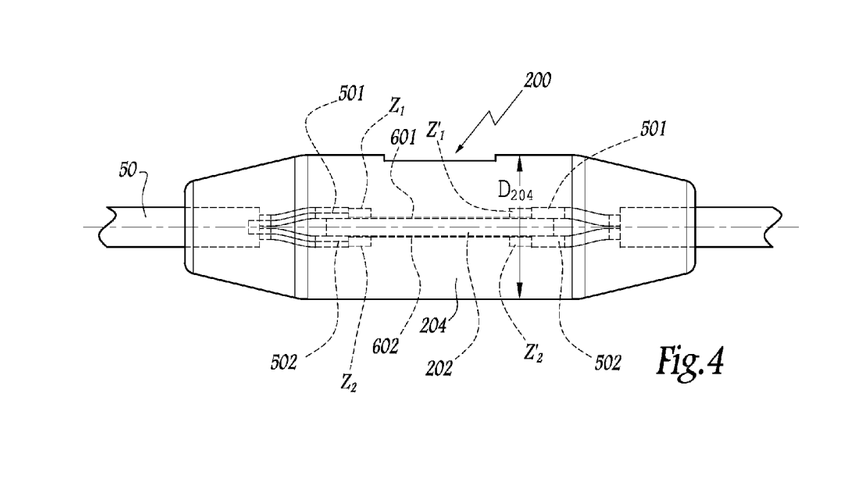
FIG. 4 is an enlarged view of detail IV-IV on FIG. 2.
Figure 5:
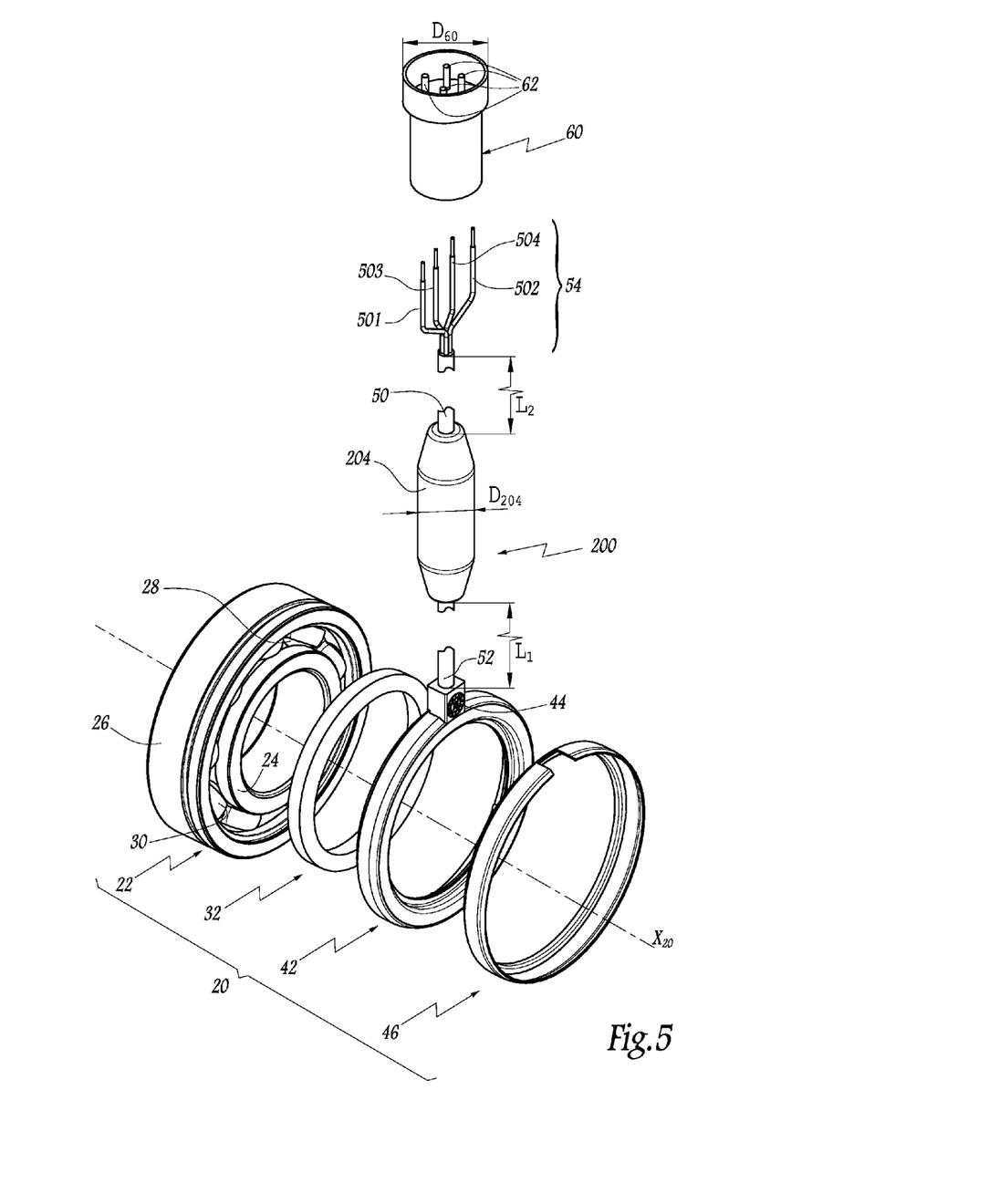
FIG. 5 is a perspective exploded view of a rolling bearing assembly according to the invention used with the rotary electric machine of FIG. 2.

Electronic components are not represented on FIG. 4, for the sake of simplicity.

The values of capacitor $C_1$, $C'_1$ and $C''_1$ are equal and chosen in the range between 0.5 nF and 5 nF. For instance, the value of capacitor $C_1$, $C'_1$ and $C'_2$ can be of 1 nF. Similarly, the values of capacitor $C_2$, $C'_2$ and $C''_2$ are equal and chosen in the range between 2 nF and 60 nF. For instance, the value of capacitors $C_2$, $C'_2$, $C''_2$ can be of about 50 nF. The value of capacitor $C_3$ is ten times the value of capacitor $C_2$, e.g. about 500 nF. The capacitance values of $C_2$ and $C_3$ are selected based on several parameters, mainly the technology of the sensor 40, the length of cable 50, the connector 60 and the voltage supply U delivered to the filter. Voltage supply U can have a value between 5V and 40V; it is typically of 12V or 24V.

Due to the structure and arrangement of EFT filter 200, it is efficient to prevent electromagnetic fast transition phenomenons inducing, in the sensing means supported by member 42, transient voltage oscillations which could damage these sensing means, in particular sensor 40.

The electronic circuit represented on FIG. 6 can be considered as a purely RC circuit for low frequency currents, that is below 20 MHz. Ferrite bead $FB_1$ adds about 500 series impedance for EFT frequencies, that is between 20 MHz and 100 MHz. Capacitors $C_2$, $C'_2$ and $C''_2$ limit the differential transient voltages during EFT phenomenons and capacitors $C_1$, $C'_1$ and $C''_1$ prevent common-mode transient to become differential mode. Moreover, capacitor $C_3$ improves the fast transient behaviour for high frequencies.

In other words, filter 200, which does not include any diode, is devoted to the protection of the sensing means against EFT and it is substantially different from ferrite rings which are sometimes mounted on voltage supply cables in order to protect electronic components from a surge voltage.

Electronic components $R_1$-$R_3$, $C_1$-$C_3$, $C'_1$, $C'_2$, $C''_1$, $C''_2$ and $FB_1$ are selected to form filter 200 while taking into account the electrical properties of the first and second parts of conductors 501 and 504 which depend, amongst others, on lengths $L_1$ and $L_2$. In other words, the location of filter 200 along cable 50 has an influence on the selection of its components.

Connector 60 has an essentially mechanical function, that is to hold the ends of conductors 501 to 504 connected to plugs 62 adapted to cooperate with corresponding plugs of connector 70.

In particular, no electronic component is embedded in connector 60 to constitute a filter, so that the filtering or protection function against EFT is performed independently of connector 60. This implies that connector 60 can be of any type adapted to connector 70. In case rolling bearing assembly 20 is sold to a fork truck lift manufacturing company, this company can choose connector 60 on the basis of the shape of connector 70, independently of the protection of the sensing means against EFT. This is advantageous in terms of harmonization of the connectors for one application, such as the manufacturing of lift truck 1.

$D_{60}$ denotes the maximum diameter of connector 60. PCB 202 and casing 204 are designed in such a way that diameter $D_{204}$ is smaller than or equal to diameter $D_{60}$ so that, upon manufacturing of lift truck 1, connector 60 and filter 200 can go through the same opening 302 in order to be connected to connecting line 90. In other words, since neither connector 60 nor filter 200 are bulky, they can be easily positioned within lift truck 1 and, insofar as opening 302 is large enough to accommodate connector 60, filter 200 does not hinder the circulation of cable 50 in lift truck 1.

Figure 7:
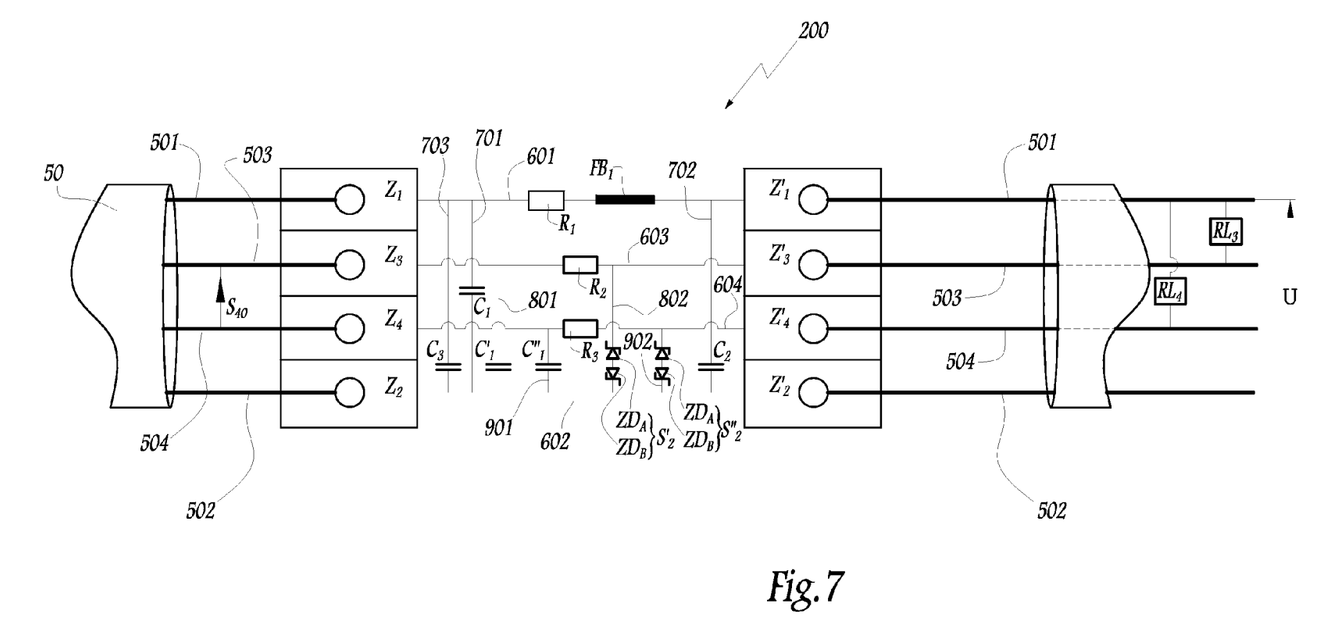
FIG. 7 is a circuit diagram similar to FIG. 6 for an EFT filter of a second embodiment of the invention.

In the second embodiment of the invention partially represented on FIG. 7, the same elements as in the first embodiment have the same references. Hereafter, one describes only the differences between this embodiment and the previous one. Electronic components represented on FIG. 7 are the same as the ones of FIG. 6 having the same reference unless otherwise specified.

In this embodiment, connecting lines 802 and 902 are respectively provided with two sets $S'_2$ and $S''_2$ of back-to-back Zener diodes $ZD_A$ and $ZD_B$. This modification with respect to the embodiment of FIG. 6 takes into account the fact that the pull-up or load resistors $RL_3$ and $RL_4$ which are respectively connected between conductors 503 and 501 and between conductors 504 and 501 can be of relatively high values, e.g. in the range between 2.2 and 2.8 k$\Omega$. The use of the Zener diodes sets $S'_2$ and $S''_2$ allows to keep a significant value to the output signal $S_{40}$ of sensor 40, even if the load resistors $RL_3$ and $RL_4$ have relatively high values. One should note here that, since these load resistors can be incorporated in an electronic control unit such as the variable-voltage regulator 90 of FIG. 1, the manufacturer of the rolling bearing assembly 20 cannot have an influence on their value. Thus, filter 200 must adapt to high value load resistors $RL_3$ and $RL_4$ at least in some instances.

The invention is not limited to bearing assemblies having Hall effect cells as sensors. Any kind of sensor outputting an electric signal can be used.

According to a non represented embodiment of the invention, the sensor can be fast in rotation with the inner ring, whereas the encoder washer is fast with the outer ring.

The invention has been described here-above in case it is used with an electric motor on a fork lift truck. Other applications can be considered with any kind of electric rotary machine, such as steering system, a band conveyer or a mill roller. In particular, other kinds of rotary electric machines, such a generator, can be equipped with a rolling bearing assembly as mentioned here-above.

The invention claimed is:

1. A rolling bearing assembly comprising:
    a rolling bearing with an inner ring, an outer ring and rolling bodies between the inner and outer rings,
    an encoder washer fast in rotation with a first one of said inner and outer rings,
    sensing means fast in rotation with a second one of said inner and outer rings, said sensing means being adapted to detect a rotation parameter of the encoder washer,
    an electric cable comprising a first conductor conveying a positive voltage to the sensing means and a second conductor conveying a negative voltage to the sensing means, wherein the electric cable includes a first end connected to said sensing means and a second end equipped with a connector that holds ends of the conductors connected to corresponding plugs, and
    a filter adapted to reduce or prevent transient voltage oscillations due to electromagnetic fast transient (EFT) phenomena, wherein the filter is mounted on said cable, between its first and second ends, and wherein the filter comprises:
        a first track joining first and second parts of the first conductor;
        a second track joining first and second parts of the second conductor;
        a first line extending from the first track to the second track, wherein the first line comprises a first capacitor; and
        a second line extending from the first track to the second track, wherein the second line comprises a second capacitor, and wherein the first and second lines are in parallel.

2. The rolling bearing assembly according to claim 1, wherein said connector is adapted to be connected to an electronic circuit.

3. The rolling bearing assembly according to claim 2, wherein said connector is without any filtering means.

4. The rolling bearing assembly according to claim 1, wherein said filter includes electronic components exclusive of diodes.

5. The rolling bearing assembly according to claim 4, wherein said filter forms an RC circuit for low frequency currents.

6. The rolling bearing assembly according to claim 1, wherein said cable further comprises:
    a third conductor and a fourth conductor conveying an output signal of said sensing means, and
    wherein said filter further comprises:
    third and fourth tracks respectively joining first and second parts of said third and fourth conductors, each of said third and fourth tracks having a resistance in series and being connected to the second track by at least two parallel lines having each a capacitor in series, the two capacitors of the two lines connecting one of said third or fourth tracks to said second tracks having different values.

7. The rolling bearing assembly according to claim 6, wherein a first capacitor, amongst the two capacitors of the two lines connecting one of said third or fourth tracks to the second track, has a value between 0.5 nF and 5 nF, whereas the second one of said capacitors has a value between 2 nF and 60 nF.

8. The rolling bearing assembly according to claim 1, wherein said cable further comprises:
    a third conductor and a fourth conductor conveying an output signal of said sensing means, and
    wherein said filter includes third and fourth tracks respectively joining first and second parts of said third and fourth conductors, each of said third and fourth tracks having a resistance in series and being connected to the second track by at least two parallel lines, wherein two lines connecting said third and fourth tracks to said second track respectively have in series a capacitor and a set of two back-to-back Zener diodes.

9. The rolling bearing assembly according to claim 6, wherein the resistance mounted in series on each of said third and fourth tracks has a value between 20$\Omega$ and 60$\Omega$.

10. The rolling bearing assembly according to claim 6, wherein said first track has a ferrite bead in series and is connected to said second track by a third line having a third capacitor in series.

11. The rolling bearing assembly according to claim 10, wherein said third capacitor has a value between 100 nF and 1000 nF.

12. The rolling bearing assembly according to claim 1, wherein the electronic components forming the filter are selected on the basis of the electronic properties of the conductors of said cable and its lengths, respectively between said first end and said filter and between said filter and said second end.

13. The rolling bearing assembly according to claim 1, wherein said filter is housed in a protective casing.

14. The rolling bearing assembly according to claim 2, wherein said connector and said casing have circular cross sections and the maximum diameter of said casing is smaller than or equal to the maximum diameter of said connector.

15. A rotary electric machine comprising:
a frame,
a stator,
a shaft, and
a rotor mounted on said shaft, wherein said shaft is supported with respect to said frame by a rolling bearing assembly, the rolling bearing assembly comprising:
  a rolling bearing with an inner ring, an outer ring, and rolling bodies between the inner and outer rings,
  an encoder washer fast in rotation with a first one of said inner and outer rings,
  sensing means fast in rotation with a second one of said inner and outer rings, said sensing means being adapted to detect a rotation parameter of the encoder washer,
  an electric cable comprising a first conductor conveying a positive voltage to the sensing means and a second conductor conveying a negative voltage to the sensing means, wherein the electric cable includes a first end connected to said sensing means and a second end equipped with a connector that holds ends of the conductors connected to corresponding plugs, and
  a filter adapted to reduce or prevent transient voltage oscillations due to electromagnetic fast transient (EFT) phenomena, wherein the filter is mounted on said cable, between its first and second ends, and wherein the filter comprises:
    a first track joining first and second parts of the first conductor;
    a second track joining first and second parts of the second conductor;
    a first line extending from the first track to the second track, wherein the first line comprises a first capacitor; and
    a second line extending from the first track to the second track, wherein the second line comprises a second capacitor, and wherein the first and second lines are in parallel.

16. A fork lift truck comprising at least one rotary electric machine, the machine having a frame, a stator, a shaft and a rotor mounted on said shaft, wherein said shaft is supported with respect to said frame by a rolling bearing assembly, the rolling bearing assembly comprising:
  a rolling bearing with an inner ring, an outer ring, and rolling bodies between the inner and outer rings,
  an encoder washer fast in rotation with the inner ring,
  sensing means coupled with the outer ring, said sensing means being adapted to detect a rotation parameter of the encoder washer,
  an electric cable comprising a first conductor conveying a positive voltage to the sensing means and a second conductor conveying a negative voltage to the sensing means, wherein the electric cable includes with a first end connected to said sensing means and a second end equipped with a connector that holds ends of the conductors connected to corresponding plugs, and
  a filter adapted to reduce or prevent transient voltage oscillations due to electromagnetic fast transient phenomenons (EFT), wherein the filter is mounted on said cable, between its first and second ends, and wherein the filter comprises:
    a first track joining first and second parts of the first conductor;
    a second track joining first and second parts of the second conductor;
    a first line extending from the first track to the second track, wherein the first line comprises a first capacitor; and
    a second line extending from the first track to the second track, wherein the second line comprises a second capacitor, and wherein the first and second lines are in parallel.

17. The rolling bearing assembly according to claim 1, wherein the first track comprises a resistor, and wherein the first and second lines are connected to the first track on opposite sides of the resistor.

18. The rolling bearing assembly according to claim 17, wherein the first track further comprises a ferrite bead in series with the resistor, and wherein the first and second lines are connected to the first track on opposite sides of the ferrite bead.

19. The rolling bearing assembly according to claim 17, wherein the filter further comprises a third line extending from the first track to the second track, wherein the third line comprises a third capacitor, wherein the first, second, and third lines are in parallel, and wherein the first and third lines are coupled to the first track on a same side of the resistor.

20. The rolling bearing assembly according to claim 1, wherein the electric cable further comprises a third conductor conveying an output signal of the sensing means, wherein the filter further comprises:
  a third track joining first and second parts of the third conductor; and
  a third line extending from the third track to the second track, wherein the third line comprises a third capacitor.

* * * * *